US007916459B2

(12) United States Patent
Lee et al.

(10) Patent No.: US 7,916,459 B2
(45) Date of Patent: Mar. 29, 2011

(54) KEY STRUCTURE AND ELECTRONIC DEVICE HAVING THE KEY STRUCTURE

(75) Inventors: Chang-Hsun Lee, Hsinchu County (TW); Hsin-Chu Lee, Taipei (TW)

(73) Assignees: Silitek Electronic (Guangzhou) Co., Ltd., Guangzhou (CN); Lite-On Technology Corp., Taipei (TW)

(*) Notice: Subject to any disclaimer, the term of this patent is extended or adjusted under 35 U.S.C. 154(b) by 318 days.

(21) Appl. No.: 12/126,932

(22) Filed: May 26, 2008

(65) Prior Publication Data

US 2009/0223795 A1 Sep. 10, 2009

(30) Foreign Application Priority Data

Mar. 7, 2008 (CN) .......................... 2008 1 0026715

(51) Int. Cl.
*H05K 5/00* (2006.01)
*H05K 7/00* (2006.01)

(52) U.S. Cl. .................................. 361/679.01; 200/5 E

(58) Field of Classification Search ............. 361/679.57, 361/679.01; 200/4, 5 E, 5 R, 7, 16, 176, 200/237, 252, 257, 431, 433, 537, 538
See application file for complete search history.

(56) References Cited

U.S. PATENT DOCUMENTS

| | | | | |
|---|---|---|---|---|
| 4,107,499 | A * | 8/1978 | Weidler | 200/558 |
| 4,918,264 | A * | 4/1990 | Yamamoto et al. | 200/5 R |
| 5,332,874 | A * | 7/1994 | Orr et al. | 200/5 B |
| 5,426,275 | A * | 6/1995 | Maeda et al. | 200/553 |
| 5,623,134 | A * | 4/1997 | Hayakawa | 200/5 R |
| 5,693,920 | A * | 12/1997 | Maeda | 200/1 B |
| 5,834,716 | A * | 11/1998 | Lee | 200/5 R |
| 5,880,419 | A * | 3/1999 | Chou | 200/6 R |
| 5,920,042 | A * | 7/1999 | Gotoh | 200/5 R |
| 6,291,782 | B1 * | 9/2001 | Isikawa | 200/14 |
| 6,434,338 | B1 * | 8/2002 | Fields | 396/301 |
| 6,570,111 | B2 * | 5/2003 | Nakagawa et al. | 200/343 |
| 6,703,571 | B2 * | 3/2004 | Nishimoto et al. | 200/6 A |
| 6,750,406 | B2 * | 6/2004 | Komatsu et al. | 200/1 B |
| 6,756,554 | B1 * | 6/2004 | Hu | 200/406 |
| 6,914,202 | B2 * | 7/2005 | Sugimoto et al. | 200/1 B |
| 6,984,793 | B1 * | 1/2006 | Chew | 200/4 |
| 7,157,650 | B2 * | 1/2007 | Rochon | 200/1 B |
| 7,449,654 | B2 * | 11/2008 | Tsuduki | 200/406 |
| 7,507,919 | B2 * | 3/2009 | Sugahara et al. | 200/6 A |
| 7,547,858 | B2 * | 6/2009 | Nagata | 200/520 |
| 2006/0021859 | A1 * | 2/2006 | Chew | 200/4 |
| 2007/0278084 | A1 * | 12/2007 | Kawamura et al. | 200/531 |
| 2008/0029374 | A1 * | 2/2008 | Christopher et al. | 200/329 |
| 2008/0029377 | A1 * | 2/2008 | Tsuduki | 200/533 |
| 2008/0237022 | A1 * | 10/2008 | Miki | 200/536 |

* cited by examiner

*Primary Examiner* — Jayprakash N Gandhi
*Assistant Examiner* — Adrian S Wilson
(74) *Attorney, Agent, or Firm* — Kile Goekjian Reed & McManus PLL

(57) ABSTRACT

A key structure includes a key body, a key portion disposed on the key body and installed inside a slot formed on a case of an electronic device in a movable manner, and an actuating portion disposed on the key body and synchronally movable with the key portion. The actuating portion includes two actuators for respectively actuating a corresponding electronic switch of the electronic device.

16 Claims, 7 Drawing Sheets

KEY STRUCTURE AND ELECTRONIC DEVICE HAVING THE KEY STRUCTURE

BACKGROUND OF THE INVENTION

1. Field of the Invention

The present invention relates to a key structure and an electronic device having the key structure, and more particularly, to a key structure and an electronic device having the key structure integrating multiple functions.

2. Description of the Prior Art

In modern information industry, there are many function keys on electronic products for allowing users to operate corresponding functions of the electronic products. However, the conventional functional key provides operation of a single function merely resulting in disadvantages of space occupation, cost increase, inconvenience of operation, and decrease in aesthetic feeling due to more function keys disposed on the electronic product corresponding to more functions.

SUMMARY OF THE INVENTION

According to the claimed invention, a key structure includes a key body, a key portion disposed on the key body and installed inside a slot formed on a case of an electronic device in a movable manner, and an actuating portion disposed on the key body and synchronally movable with the key portion. The actuating portion includes two actuators for respectively actuating a corresponding electronic switch of the electronic device.

According to the claimed invention, the two actuators move in a same direction.

According to the claimed invention, the tact actuator is a protrusion protruding inward the case of the electronic device, and the slide actuator is a sunken portion on the actuating portion.

According to the claimed invention, the key structure further includes an elastic component connected to an end of the actuating portion far away from the actuators.

According to the claimed invention, the key structure further includes a support component disposed on an inner side of the case of the electronic device and the elastic component contacts against the support component.

According to the claimed invention, the elastic component is an U-shaped elastic cantilever.

According to the claimed invention, the elastic component is a spring.

According to the claimed invention, the U-shaped elastic cantilever is precompressed for contacting against the support component.

According to the claimed invention, the U-shaped elastic cantilever comprises an extending part for inserting in a recess on the support component.

According to the claimed invention, the key portion is disposed on an outer side of the key body and the actuating portion is disposed on an inner side of the key body.

According to the claimed invention, an electronic device includes a case whereon a slot is formed on, a circuit board, and two electronic switches connected to the circuit board. Each electronic switch includes a trigger. The electronic device includes a key structure including a key body, a key portion disposed on the key body and installed inside the slot in a movable manner, and an actuating portion disposed on the key body and synchronally movable with the key portion. The actuating portion includes two actuators for respectively actuating the corresponding electronic switch.

According to the claimed invention, a frame is disposed on an inner side of the case, the slot is formed on the frame, and the key body is installed inside the frame in a slidable manner along the frame.

According to the claimed invention, the electronic switches are a tact switch and a slide switch respectively, the trigger of the tact switch is a tact head, the trigger of the slide switch is a slide head, and the trigger of the tact switch and the trigger of the slide switch are triggered in a same direction.

According to the claimed invention, the two actuators are a tact actuator and a slide actuator respectively, the tact actuator is a protrusion protruding inward the case for triggering the tact head of the tact switch, and the slide actuator is a sunken portion on the actuating portion for containing the slide head of the slide switch.

According to the claimed invention, the key structure further includes an elastic component connected to an end of the actuating portion far away from the actuators, and a support component disposed on an inner side of the case, the elastic component contacting against the support component.

According to the claimed invention, the elastic component is an U-shaped elastic cantilever comprising an extending part for inserting in a recess on the support component, and the U-shaped elastic cantilever is precompressed for contacting against the support component.

According to the claimed invention, the tact switch is for turning on or turning off a power supply selectively, and the slide switch is for locking or releasing keys selectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
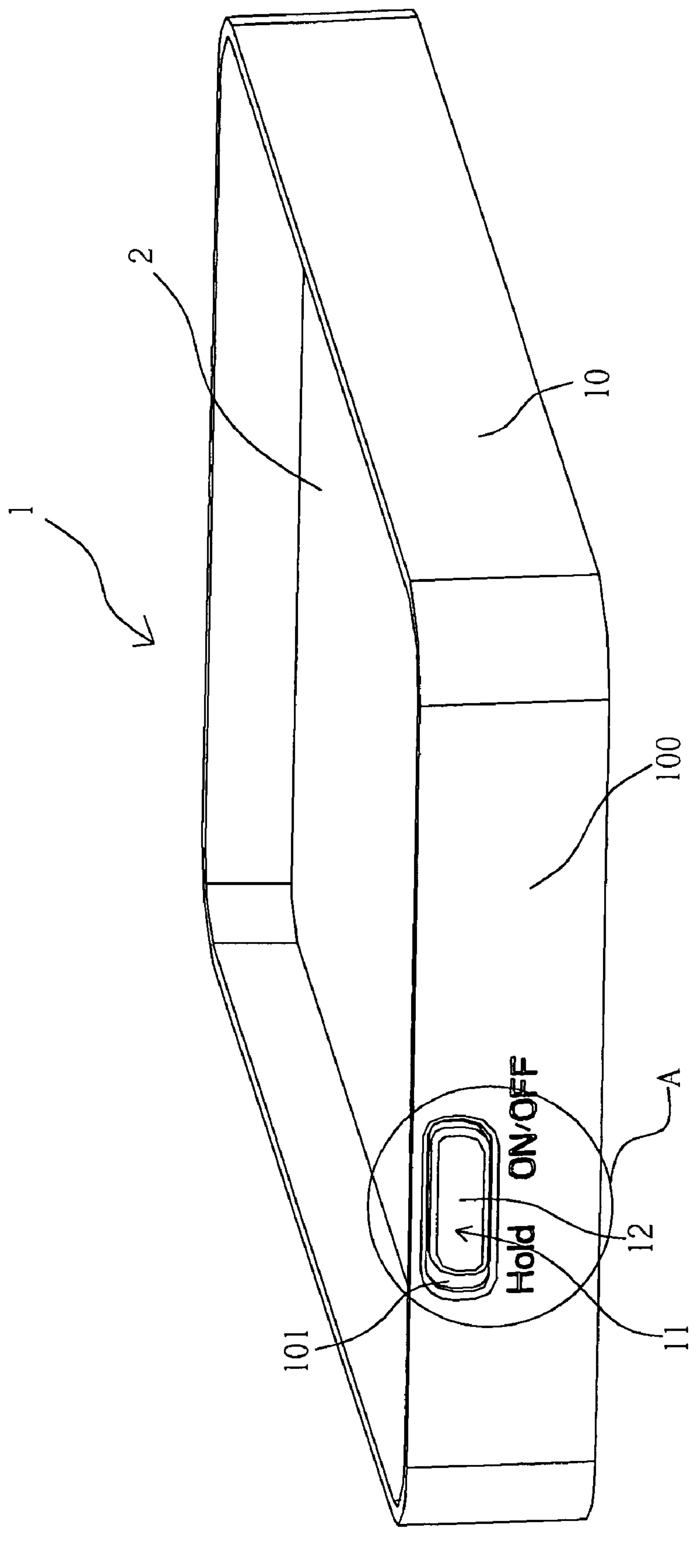
FIG. 1 and FIG. 2 are schematic drawings of an electronic device according to a preferred embodiment of the present invention.
Figure 2:
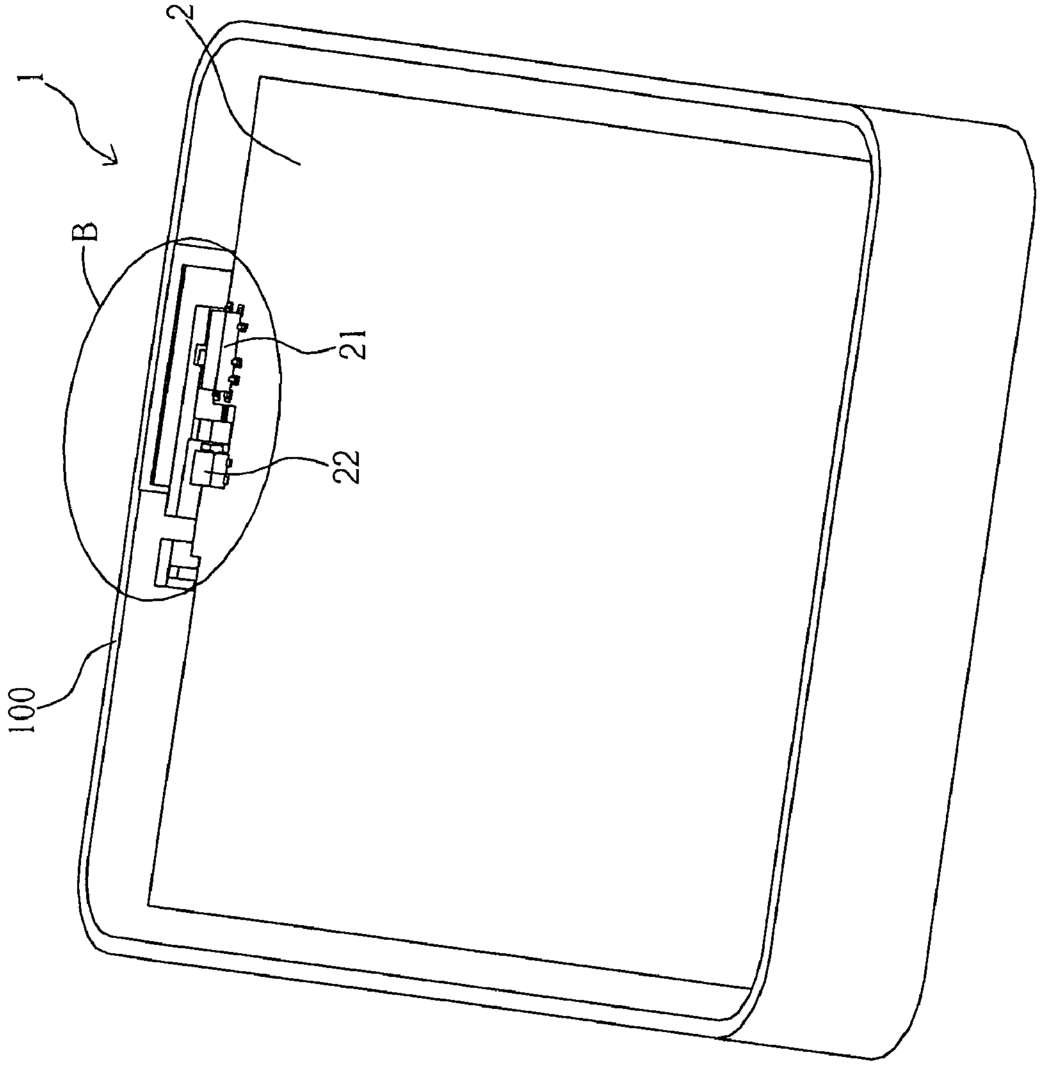
Figure 7:
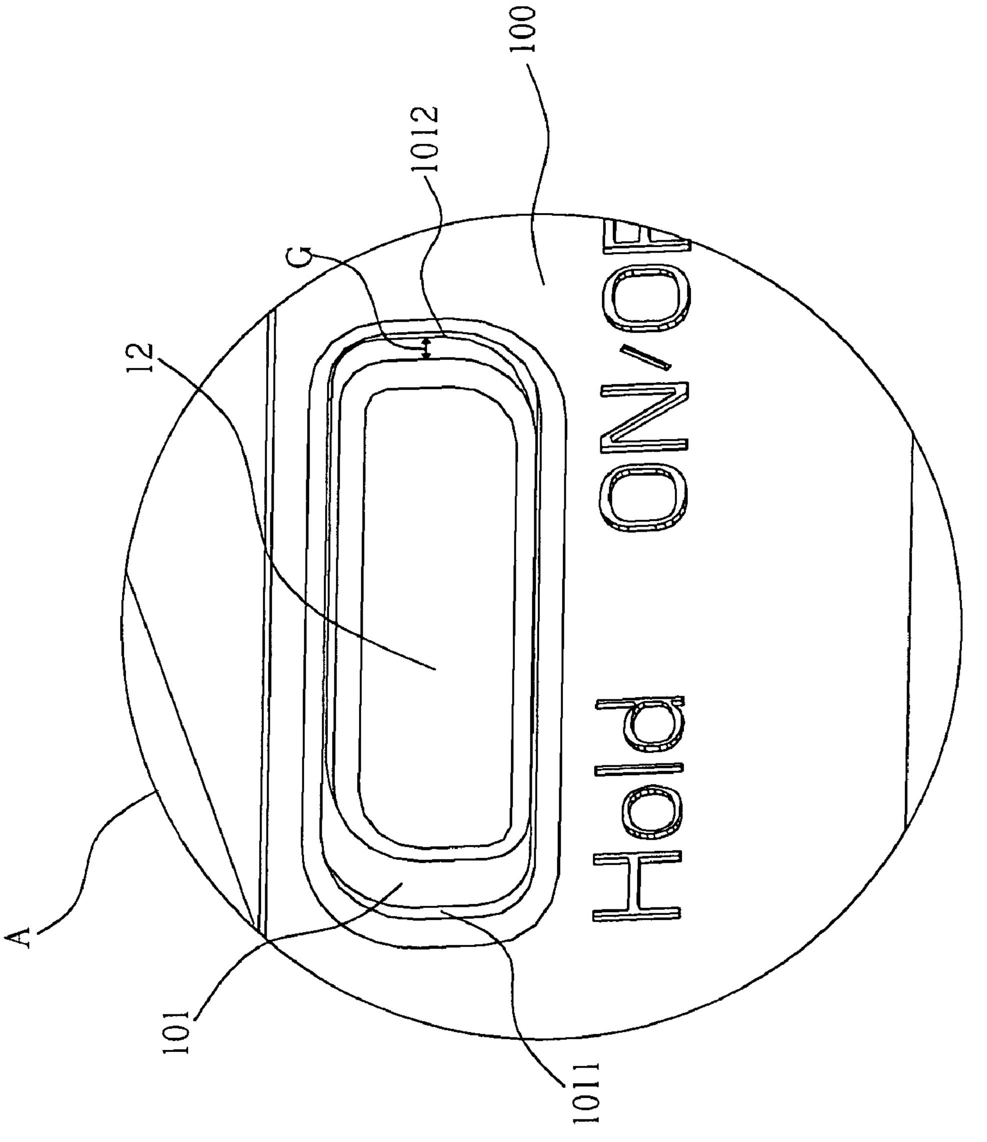
FIG. 7 is an enlarged diagram of a part A in FIG. 1 according to the preferred embodiment of the present invention.

Please refer to FIG. 1 and FIG. 2, FIG. 1 and FIG. 2 are schematic drawings of an electronic device 1 according to a preferred embodiment of the present invention. The electronic device 1 includes a case 10 and a key structure 11. An upper covering of the case 10 is omitted to illustrate in figures for presenting the key structure 11 clearly. Preferably, the key structure 11 is disposed on a lateral surface 100 on the case 10. The key structure 11 also can be disposed at other position on the case 10. A slot 101 is formed on a lateral surface 100 on the case 10. A key portion 12 of the key structure 11 is installed inside the slot 101. A size of the key portion 12 is smaller than a size of the slot 101 so that the key portion 12 can slide in the slot 101. The slot 101 has a first end 1011 and a second end 1012 for limiting the key portion 12 so that the electronic device 1 operates corresponding functions when the key portion 12 is positioned on the first end 1011 or the second end 1012. In this embodiment, the first end 1011 corresponds to a locking function, and the second end 1012 corresponds to an ON/OFF function. That is, when a user pushes the key portion 12 to the first end 1011, the keys of the electronic device 1 are locked for preventing being triggered inadvertently. On the other hand, when the user pushes the key portion 12 to an ON/OFF end between the first end 1011 and the second end 1012, the keys of the electronic device 1 are released. A gap G is formed between the ON/OFF end and the second end 1012 as shown in FIG. 7. The key portion 12 is capable of sliding between the ON/OFF end and the second end 1012 for turning on or turning off a power supply selectively. The two ends of the slot 101 are not limited to correspond to the above-mentioned functions. For example, the first end 1011 can correspond to a power-saving function.

As shown in FIG. 2, a circuit board 2 is installed inside the case 10. A slide switch 21 and a tact switch 22 are electrically connected to the circuit board 2 and neighboring to the key structure 11. The sliding switch 21 is located nearby the first end 1011, and the tact switch 22 is located nearby the ON/OFF end. In this embodiment, the sliding switch 21 is for locking or releasing keys selectively and the tact switch 22 is for turning on or turning off the power supply.

Figure 3:
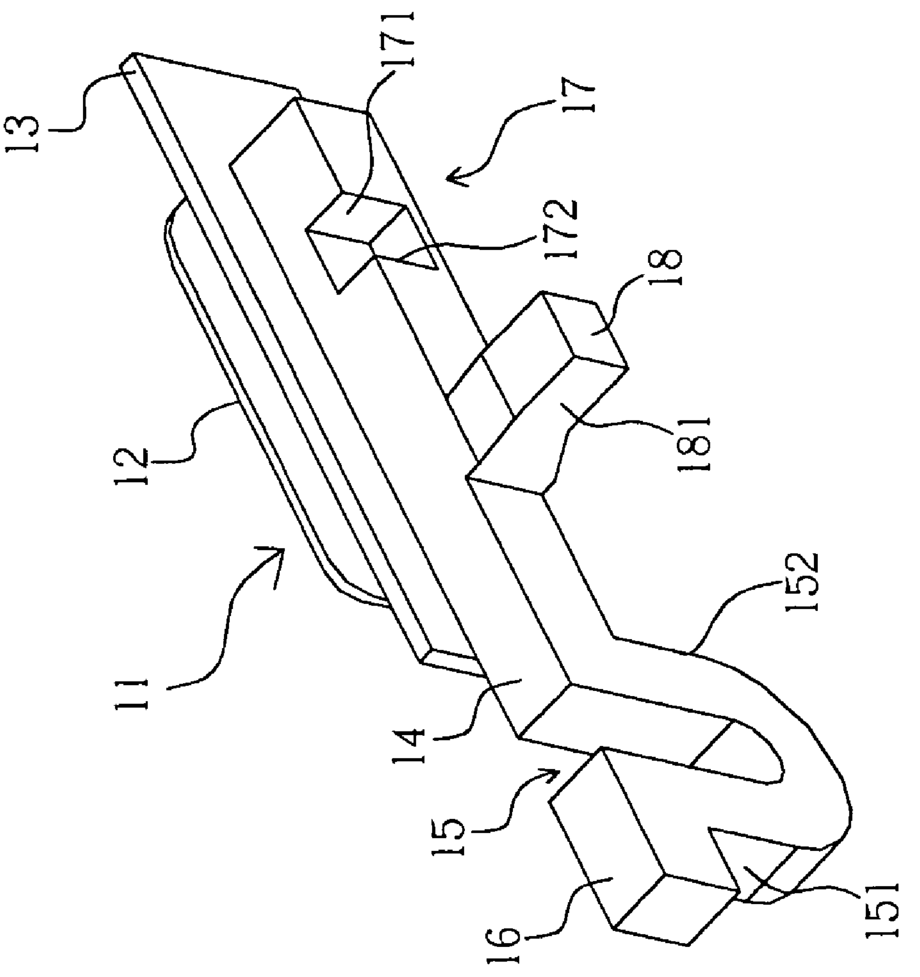
FIG. 3 is a schematic drawing of a key structure according to the preferred embodiment of the present invention.
Figure 4:
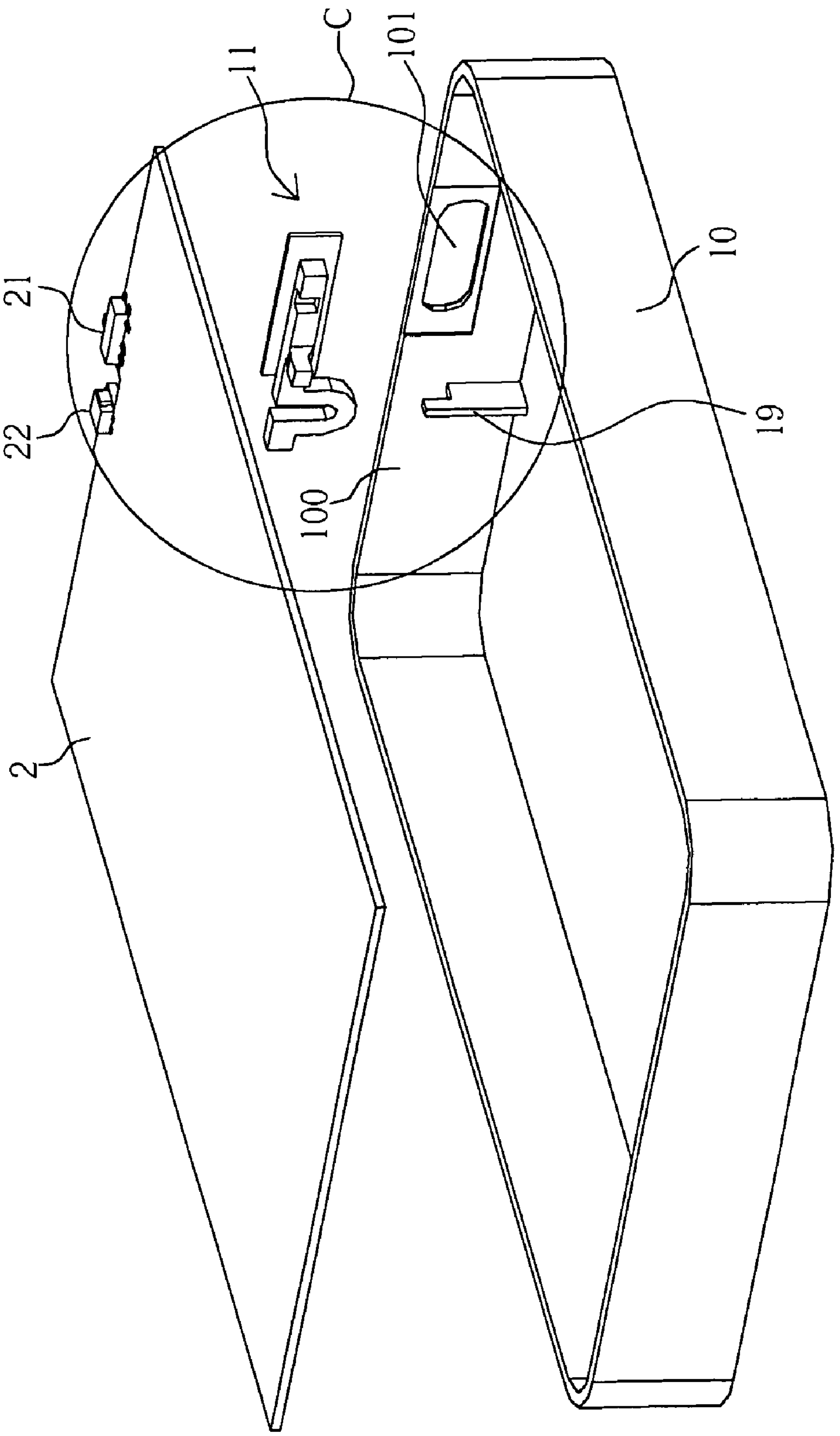
FIG. 4 is an exploded diagram of the electronic device according to the preferred embodiment of the present invention.
Figure 5:
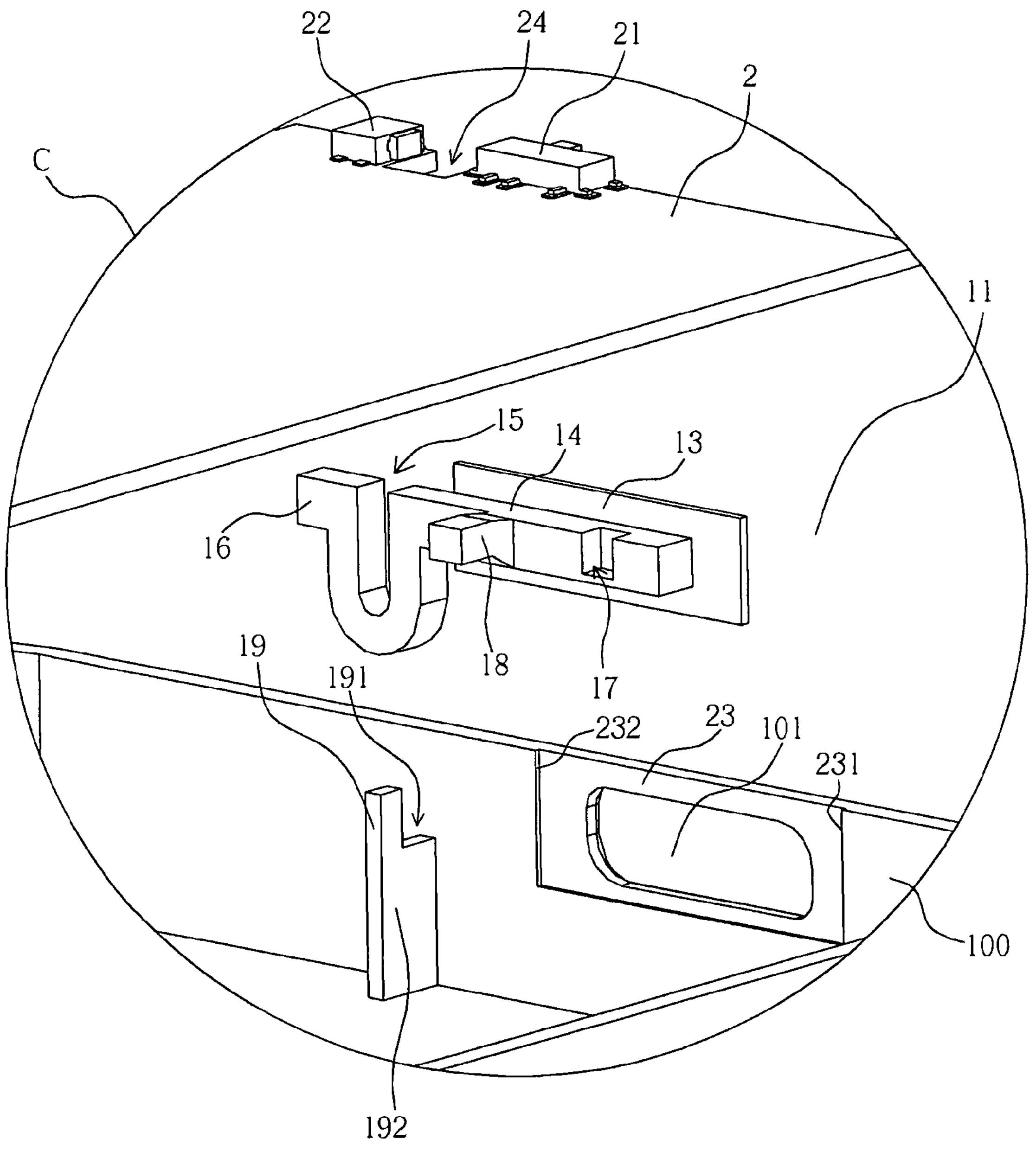
FIG. 5 is an enlarged diagram of a part C in FIG. 4 according to the preferred embodiment of the present invention.
Figure 6:
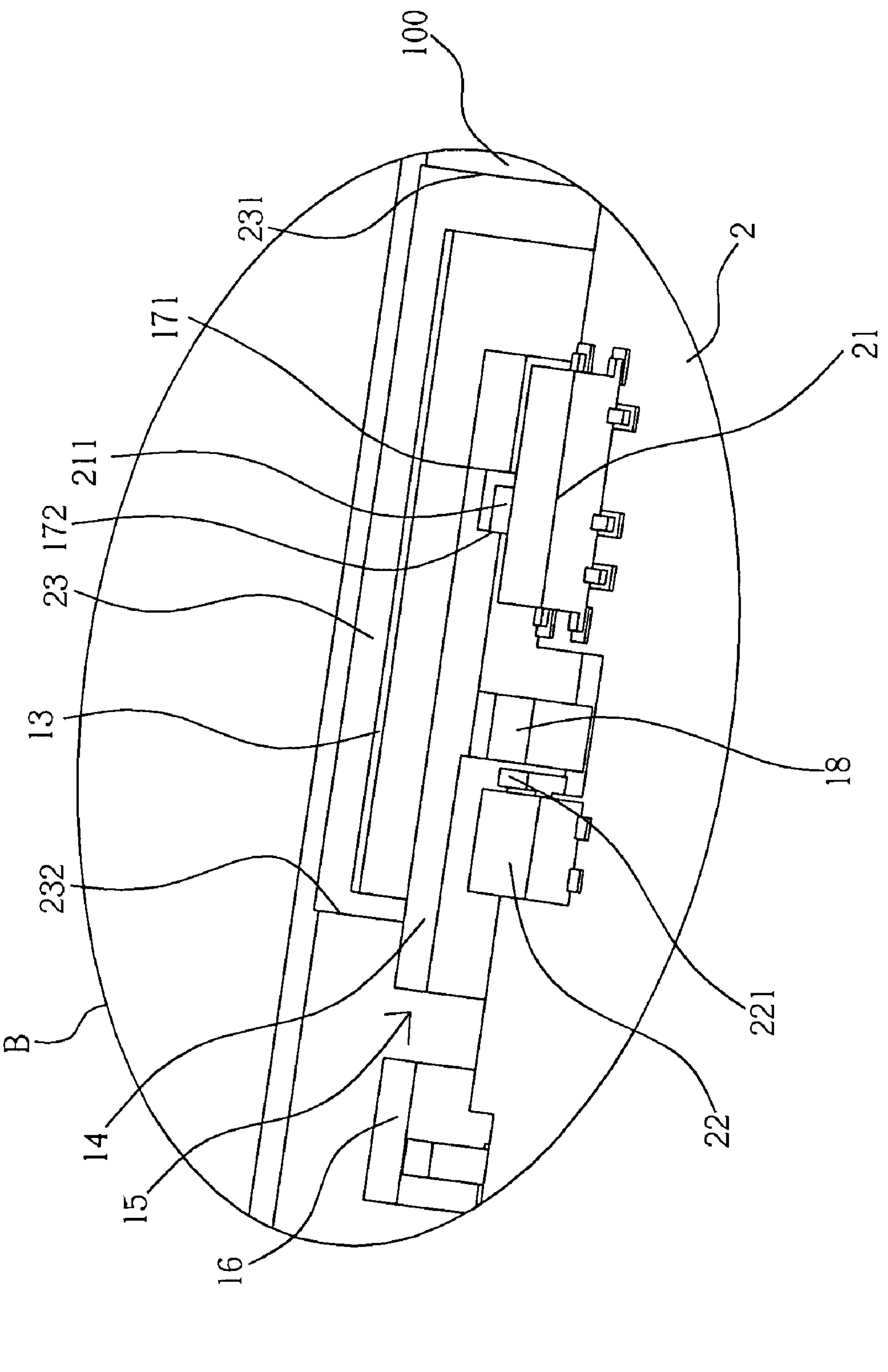
FIG. 6 is an enlarged diagram of a part B in FIG. 2 according to the preferred embodiment of the present invention.

Please refer to FIG. 3 to FIG. 7. FIG. 3 is a schematic drawing of the key structure 11 according to the preferred embodiment of the present invention. FIG. 4 is an exploded diagram of the electronic device 1 according to the preferred embodiment of the present invention. FIG. 5 is an enlarged diagram of a part C in FIG. 4 according to the preferred embodiment of the present invention. FIG. 6 is an enlarged diagram of a part B in FIG. 2 according to the preferred embodiment of the present invention. FIG. 7 is an enlarged diagram of a part A in FIG. 1 according to the preferred embodiment of the present invention. The key structure 11 includes a key body 13 on which the key portion 12 and an actuating portion 14 are disposed. The key portion 12 is connected to one side of the key body 13 and installed on an outer side of the lateral surface 100 on the case 10, and the actuating portion 14 is connected to the opposite side of the key body 13 and installed on an inner side of the lateral surface 100 on the case 10. The actuating portion 14 includes a slide actuator 17 and a tact actuator 18. The slide actuator 17 can be an sunken portion on the actuating portion 14 for containing an slide head 221 of the slide switch 21 and includes a first plane 171 and a second plane 172 located in positions corresponding to two sides of the slide head 211 respectively for limiting the slide head 211 in locking or releasing positions. The tact actuator 18 can be a protrusion protruding inward the case 10 and includes a tact plane 181 for triggering the tact switch 22 so as to turn on or turn off the power supply. The key structure 11 further includes an elastic component 15 connected to an end of the actuating portion 14 far away from the slide actuator 17 and the tact actuator 18. Preferably, the elastic component 15 can be an U-shaped elastic cantilever, a V-shaped elastic cantilever, or a spring. An end of the U-shaped elastic cantilever is connected to the actuating portion 14, and the other end of the U-shaped elastic cantilever is connected to an extending part 16. Preferably, the extending part 16 can be a block.

Please refer to FIG. 4 to FIG. 6, a frame 23 is disposed on an inner side of the lateral surface 100 of the case 10, and the slot 101 is formed on the frame 23. A size of the frame 23 is larger than a size of the slot 101. The key body 13 of the key structure 11 is installed inside the frame 23 in a slidable manner along the frame 23 and synchronally with the key portion 12. The frame 23 includes a first plane 231 and a second plane 232, and the key body 13 is capable of sliding between the first plane 231 and the second plane 232.

A support component 19 protrudes from an inner side of the lateral surface 100 of the case 10. A recess 191 is disposed on the support component 19, and the extending part 16 can be inserted on the recess 191. When the key structure 11 is moving, the extending part 16 keeps inserting in the recess 191 so that the key structure 11 can slide smoothly. The key structure 11 can be installed on the lateral surface 100 of the case 10, and the elastic component 15 is precompressed for contacting against the support component 19. The elastic component 15 includes a first straight arm 151 and a second straight arm 152. The first straight arm 151 and the second straight arm 152 are deformable elastically. The first straight arm 151 keeps contacting against a vertical wall 192 of the support component 19, and elastic force provided by the second straight arm 152 can drives the actuating portion 14 to move to the first plane 231 so that the second plane 172 of the slide actuator 17 can contact against the slide head 211.

Please refer to FIG. 3 and FIG. 6. An indentation 24 is formed on the circuit board 2 and between the slide switch 21 and the tact switch 22. The indentation 24 is adjacent to the tact switch 22. The slide head 211 protrudes from the slide switch 21 and is contained inside the slide actuator 17. The first plane 171 and the second plane 172 contact against both sides of the slide head 211 respectively. The tact actuator 18 is contained inside the indentation 24 and is capable of sliding inside the indentation 24. The tact head 221 protrudes to the indentation 24 and opposite to the tact plane 181 of the act actuator 18 so as to trigger the tact head 221.

When the key portion 12 of the key structure 11 is located on the first end 1011 (Hold end), the key body 13 is nearby a first plane 231 of the frame 23. At this time, the slide head 221 of the slide switch 21 slides close to the first end 1011. The second plane 172 of the slide actuator 17 contacts against the slide head 211 so as to actuate the hold function. That is, the sliding switch 21 locks keys of the electronic device 1.

When the user wants to unlock the keys of the electronic device 1, the user can push the key portion 12 to the ON/OFF end on the slot 101 so that the key body 13 slides in the frame 23 simultaneously and the first plane 171 of the slide actuator 17 on the actuating portion 14 connected to the key body 13 contacts with the slide head 211 and pushes the slide head 211 for leaving the Hold position. Simultaneously, the tact actuator 18 slides in the indentation 24 to the slide head 211, and the elastic component 15 is further compressed so as to reserve elastic energy. The user can release the key portion 12 after the slide head 211 leaves the Hold position so that the slide switch 21 can release the lock of the keys of the electronic device 1. At this time, the elastic component 15 can restore to an original condition so as to release elastic energy for pushing the actuating portion 14 so that the second plane 172 of the slide actuator 17 can contact against the slide head 211 again.

The user can push the key portion 12 to the second end 1012 on the slot 101 for turning on or turning off the power supply selectively. The tact plane 181 of the tact actuator 18 presses the tact head 221 for a predetermined period so as to trigger the tact switch 22 for turning on or turning off the power supply. At this time, the elastic component 15 is further compressed so as to reserve elastic energy. Then the user can release the key portion 12 so that the tact switch 22 can switch the condition of the power supply. At this time, the elastic component 15 can restore to an original so that the tact actuator 18 on the actuating portion 14 rebounds and the tact plane 181 separates from the tact head 221.

When the user wants to lock the keys of the electronic device 1, the user can push the key portion 12 to the Hold end so that the second plane 172 of the slide actuator 17 can drive the slide head 211 to move accordingly until the key portion 12 reaches the Hold end for actuating the hold function. That is, the sliding switch 21 locks keys of the electronic device 1.

In contrast to the prior art, the present invention provides a key structure and a related electronic device capable of operating multiple functions just by utilizing one key in different strokes. The key structure of the present invention has advantages of space economization, cost reduction, convenience of operation, and increase in aesthetic feeling by integrating multiple functions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A key structure for an electronic device having an external case unit and an internal circuit board, wherein the case unit having a key slot and a key support component, and wherein the circuit board having two electrical switches, the key structure comprising:

a key body having a key portion and an actuating portion;

wherein the key portion is partially exposedly disposed in the key slot of the case unit in a slidable manner; and wherein the actuating portion comprise an elastic component at one end thereof and is synchronously slidable with the key portion, the actuating portion comprising two actuating members for respectively actuating the corresponding electrical switches of the electronic device.

2. The key structure of claim 1, wherein the two actuating members are slidable in a same direction.

3. The key structure of claim 1, wherein the two actuating members are a tact actuator and a slide actuator respectively.

4. The key structure of claim 3, wherein the tact actuator is a protrusion protruding inward the case unit of the electronic device, and the slide actuator is a sunken portion on the actuating portion.

5. The key structure of claim 1, wherein the elastic component is an U-shaped elastic cantilever.

6. The key structure of claim 1, wherein the elastic component is a spring.

7. The key structure of claim 5, wherein the U-shaped elastic cantilever is pre-compressed for contacting against the support component of the electronic device.

8. The key structure of claim 7, wherein the U-shaped elastic cantilever comprises an extending part for inserting in a recess on the support component.

9. The key structure of claim 1, wherein the key portion is disposed on an outer side of the key body and the actuating portion is disposed on an inner side of the key body.

10. An electronic device comprising:

a case unit having a key slot;

a circuit board having two electrical switches disposed in the case unit, wherein each switch comprising a trigger; and a key structure comprising:

a key body having a key portion and an actuating portion, wherein the key portion is partially exposedly disposed in the key slot of the case unit in a slidable manner; and wherein the actuating portion comprises an elastic component at one end thereof and is synchronously slidable with the key portion, the actuating portion comprising two actuating members for respectively actuating the corresponding electrical switches of the circuit board.

11. The key structure of claim 10, wherein a frame is disposed on an inner side of the case unit, the slot is formed on the frame, and the key body is installed inside the frame in a slidable manner along the frame.

12. The key structure of claim 10, wherein the electronic switches are a tact switch and a slide switch respectively, wherein the trigger of the tact switch is a tact head, the trigger of the slide switch is a slide head, and the triggering direction of the tact switch is substantially parallel to the sliding direction of the slide switch.

13. The key structure of claim 12, wherein the two actuating members are a tact actuator and a slide actuator respectively, the tact actuator is a protrusion protruding inward the case for triggering the tact head of the tact switch, and the slide actuator is an sunken portion on the actuating portion for containing the slide head of the slide switch.

14. The key structure of claim 13, wherein the key structure further comprises:

a support component disposed on an inner side of the case unit, the elastic component contacting against the support component.

15. The key structure of claim 14, wherein the elastic component is an U-shaped elastic cantilever having an extending part for inserting in a recess on the support component, and the U-shaped elastic cantilever is pre-compressed for contacting against the support component.

16. The key structure of claim 12, wherein the tact switch is for turning on or turning off a power supply selectively, and the slide switch is for engaging key-locking function or key-releasing function selectively.

* * * * *